(12) United States Patent
Kobayashi

(10) Patent No.: US 8,171,977 B2
(45) Date of Patent: May 8, 2012

(54) SHEET PEELING APPARATUS AND PEELING METHOD

(75) Inventor: Kenji Kobayashi, Tokyo (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 13/062,409

(22) PCT Filed: Aug. 27, 2009

(86) PCT No.: PCT/JP2009/064911
§ 371 (c)(1),
(2), (4) Date: Mar. 4, 2011

(87) PCT Pub. No.: WO2010/026910
PCT Pub. Date: Nov. 3, 2010

(65) Prior Publication Data
US 2011/0162790 A1    Jul. 7, 2011

(30) Foreign Application Priority Data
Sep. 4, 2008 (JP) ................................ 2008-226917

(51) Int. Cl.
*B32B 38/10* (2006.01)
(52) U.S. Cl. ........ 156/760; 156/714; 156/715; 156/759; 156/764; 156/930; 156/941
(58) Field of Classification Search ............... 156/247, 156/714, 715, 759, 760, 764, 930, 941
See application file for complete search history.

(56) References Cited

U.S. PATENT DOCUMENTS
5,891,298 A * 4/1999 Kuroda et al. ............... 156/716
2007/0235131 A1* 10/2007 Tsujimoto et al. ........... 156/344

FOREIGN PATENT DOCUMENTS
JP    2005-175253 A    6/2005
JP    2006-012971 A    1/2006
JP    2009-141314 A    6/2009

OTHER PUBLICATIONS
International Search Report of PCT/JP2009/064911, date of mailing Sep. 29, 2009.

* cited by examiner

*Primary Examiner* — Mark A Osele
(74) *Attorney, Agent, or Firm* — Westerman, Hattori, Daniels & Adrian, LLP

(57) ABSTRACT

A sheet peeling apparatus 10 comprises: a supporting means 11 for supporting a semiconductor wafer W stuck with an adhesive sheet S; a feeding means 12 for feeding out a peeling tape T; a sticking means 14 for sticking the peeling tape T to the adhesive sheet S; a holding means 15 for holding a tip side in a feeding direction of the peeling tape T; and a peeling means 16 for imparting a peeling force to the adhesive sheet S. The peeling means 16 includes a peeling roller 44, and the peeling roller 44 abuts against an adhesive agent layer side of the peeling tape T stuck on the adhesive sheet S, and peeling off the adhesive sheet S in a state in which a turned-back portion c is formed by turning back a peeled end side of the adhesive sheet S.

2 Claims, 5 Drawing Sheets

SHEET PEELING APPARATUS AND PEELING METHOD

FIELD OF THE INVENTION

The present invention relates to a sheet peeling apparatus and peeling method, and in particular a sheet peeling apparatus and peeling method suited for peeling off an adhesive sheet stuck on a semiconductor wafer and the like.

BACKGROUND OF THE ART

A semiconductor wafer (hereinafter, simply referred to as "wafer") is stuck with an adhesive sheet for protecting a circuit surface thereof, and subjected to peeling off the adhesive sheet from the wafer in a stage after the wafer is subjected to a predetermined treatment.

For an apparatus for peeling off the above-described adhesive sheet, for example, an arrangement is known which is capable of peeling off the adhesive sheet by sticking an elongated strip-shaped peeling tape to the adhesive sheet, and winding the adhesive sheet, as described in Patent document 1.

[Patent document 1] Japanese Patent Application Laid-Open No. 2005-175253

SUMMARY OF THE INVENTION

[Problem to be Solved by the Invention]

However, a sheet peeling apparatus, described in Patent document 1, has an arrangement in which a pressing roller R rolls on an adhesive sheet S when a peeling tape T stuck on the adhesive sheet S is wound, as schematically shown in FIG. 5. In a region of the adhesive sheet S on which the peeling tape T is stuck, peeling can be realized in close contact with the outer circumference of the pressing roller R due to transmission of a tension force of the peeling tape T. However, in adhesive sheet portions that are located away from a sticking position of the peeling tape T, peeling delay E occurs due to stretch of the adhesive sheet S. When such peeling delay E occurs, a peeled end of the adhesive sheet S cannot be placed in close contact with an outer circumferential surface of the pressing roller R, so that there arises such a disadvantage that peeling effect of peeling the adhesive sheet S from the wafer while pressing with the pressing roller R is not sufficiently obtained.

On the other hand, when a pressing force of the pressing roller R is reduced, there arises such a disadvantage that the wafer W rises so that the wafer W breaks.

[Object of the Invention]

The present invention has been proposed in view of the above disadvantages. It is an object of the present invention to provide a sheet peeling apparatus and peeling method capable of peeling off an adhesive sheet while preventing an adherend such as a wafer from breaking, without generating peeling delay on a peeled end side, when peeling off the adhesive sheet.

[Means for Solving Problems]

In order to achieve the above object, the present invention adopts an arrangement of a sheet peeling apparatus comprising: a supporting means for supporting an adherend stuck with an adhesive sheet; a feeding means for feeding out a peeling tape for peeling off the adhesive sheet; a sticking means for sticking the peeling tape to the adhesive sheet in a state in which a lead end side of the peeling tape is positioned outside the outer circumference of the adhesive sheet; a holding means for holding the lead end side of the peeling tape; and a peeling means for imparting a peeling force to the adhesive sheet by movement relative to the supporting means; wherein the peeling means includes a peeling roller, and the peeling roller abuts on an adhesive agent layer side of the peeling tape stuck on the adhesive sheet, and peeling off the adhesive sheet in a state in which a turned-back portion is formed by turning back a peeled end side of the adhesive sheet.

In the present invention, such an arrangement is preferably adopted that the holding means includes a displacement mechanism, and enables the turned-back portion to be formed by slackening the peeling tape.

Further, the present invention adopts a method of a sheet peeling method for sticking a peeling tape to an adhesive sheet stuck on an adherend, and peeling off the adhesive sheet via the peeling tape, comprising: positioning a peeling means on an adhesive agent layer side of the peeling tape after sticking the peeling tape to the adhesive sheet in a state in which a lead end side of the peeling tape is positioned outside the outer circumference of the adhesive sheet; forming a turned-back portion by turning back a peeled end side of the adhesive sheet between the adherend and the peeling means when peeling by moving the peeling means in a peeling direction along the adhesive sheet; and then, peeling off the adhesive sheet from the adherend by relatively moving the peeling means in the peeling direction, while maintaining the turned-back portion.

In the sheet peeling method, such a method may be adopted that slack is formed in the peeling tape after the peeling tape is stuck on the adhesive sheet, and such slack enables the turned-back portion to be formed.

[Effect Of The Invention]

The present invention can peel off the adhesive sheet in a state that the peeled end side of the adhesive sheet is turned back since the peeling means is configured to be positioned on the adhesive agent layer side of the adhesive sheet. Therefore, a folded edge i.e. a peeled edge of the adhesive sheet can be maintained in a linear arrangement, and such a disadvantage can be avoided that a portion of the adhesive sheet is stretched to generate peeling delay.

Also, when the holding means includes the displacement mechanism, it is possible to ensure the length for performing the above mentioned folding by slackening the peeling tape, and prevent peeling from being impossible due to the tension force becoming excessive.

EXPLANATION OF REFERENCE NUMERALS

Figure 1:
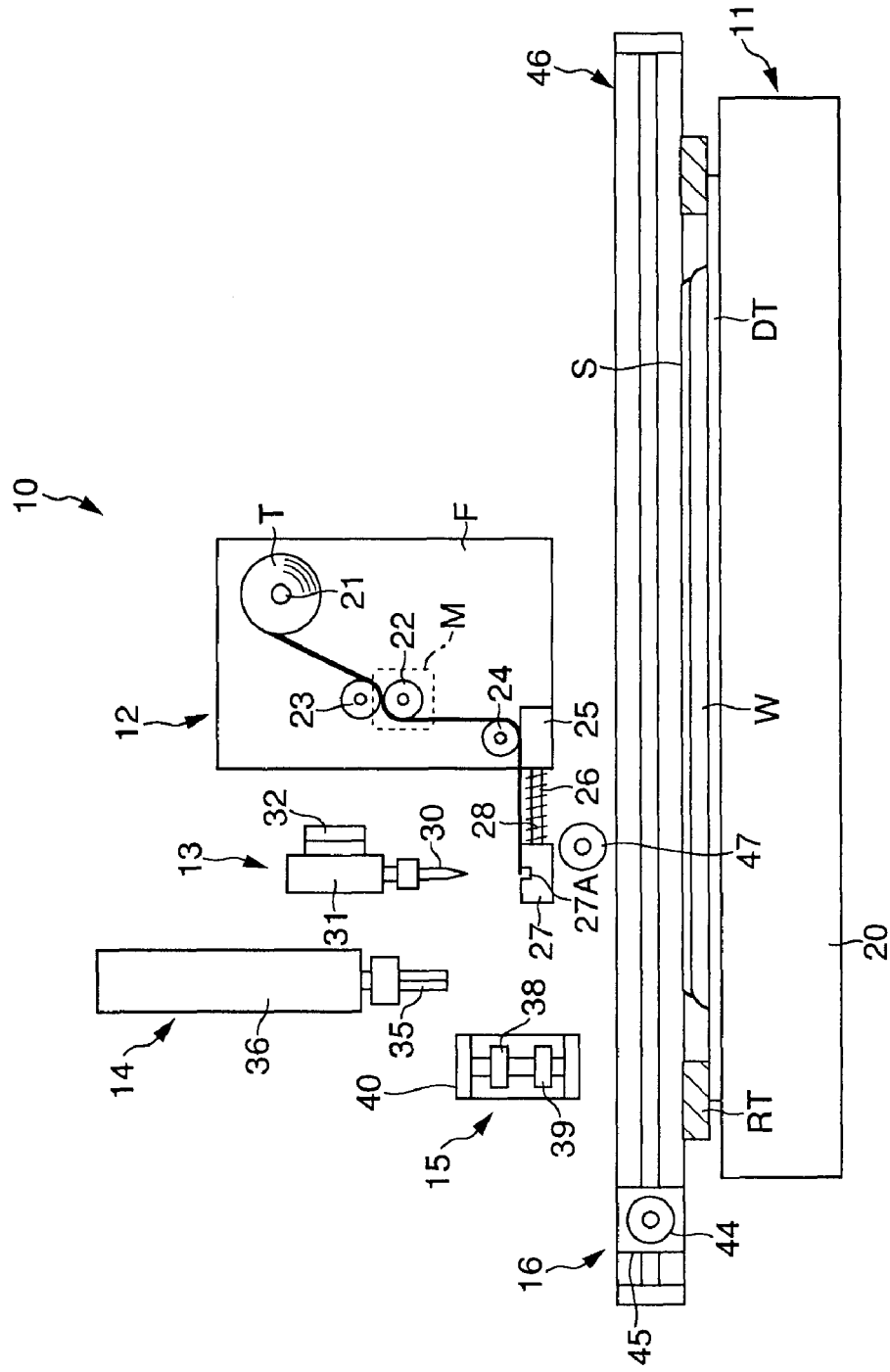
FIG. 1 is a schematic front view of a sheet peeling apparatus according to the embodiment.

10: sheet peeling apparatus
11: supporting means
12: feeding means
14: sticking means
15: holding means 16: peeling means
40: chuck cylinder (displacement mechanism)
44: peeling roller
c: turned-back portion
S: adhesive sheet
T: peeling tape
W: semiconductor wafer (adherend)
Description of the Preferred Embodiments Hereinafter, an embodiment of the present invention is described with reference to the drawings.

FIG. 1 shows a schematic front view of a sheet peeling apparatus according to the embodiment. In this figure, a sheet peeling apparatus 10 comprises: a supporting means 11 for supporting a wafer W as an adherend stuck with an adhesive sheet S; a feeding means 12 for feeding out a strip-shaped peeling tape T for peeling off the adhesive sheet S; a cutting means 13 for cutting the peeling tape T at each predetermined length; a sticking means 14 for sticking the peeling tape T to the adhesive sheet S in a state in which a lead end side of the peeling tape T is positioned outside the outer circumference of the adhesive sheet S; a holding means 15 for holding the lead end side of the peeling tape T; and a peeling means 16 for imparting a peeling force to the adhesive sheet S by movement relative to the supporting means 11. Here, in the embodiment, the wafer W, which is mounted in a ring frame RF via a dicing tape DT, is supported by the supporting means 11 in a state that the adhesive sheet S is provided on the upper surface side, but is not particularly limited thereto. Also, an ultraviolet curable adhesive agent is used as an adhesive agent layer of the adhesive sheet S, which is supported by the supporting means 11 in a state that has been previously subjected to ultraviolet curing.

The supporting means 11 includes a table 20 having a suction surface on the upper surface side, wherein the wafer W mounted in the ring frame RF is placed on the table 20. Note that the table 20 can be provided to be capable of moving in a left and right direction in FIG. 1 through a moving means (not shown).

The feeding means 12 is supported by a frame F, and comprises: a support roller 21 for supporting the peeling tape T so that the peeling tape T can be fed out; a drive roller 22 for imparting a feed-out force to the peeling tape T by driving of a motor M; a pinch roller 23 for sandwiching the peeling tape T between the drive roller 22 and the pinch roller 23 a guide roller 24 which is located in a lower end section of the frame F; and a bush 25 for supporting a shaft 26, movably in a left and right direction in FIG. 1, by which a tape guide plate 27 is supported. The tape guide plate 27 has a recessed portion 27A on an upper surface thereof, and is always biased leftward in FIG. 1 by a coil spring 28 which is provided on the outer periphery side of the shaft 26.

The cutting means 13 comprises a cutter blade 30, a cylinder 31 for moving ahead and back the cutter blade 30 in a vertical direction therein; and a cylinder 32 for supporting the cylinder 31 movably in a direction perpendicular to the paper surface in FIG. 1. The cutting means 13 is configured to be capable of cutting the peeling tape T by movement of the cylinder 32 in a state that a tip of the cutter blade 30 is located within the recessed portion 27A of the tape guide plate 27 through the cylinder 31.

Figure 2:
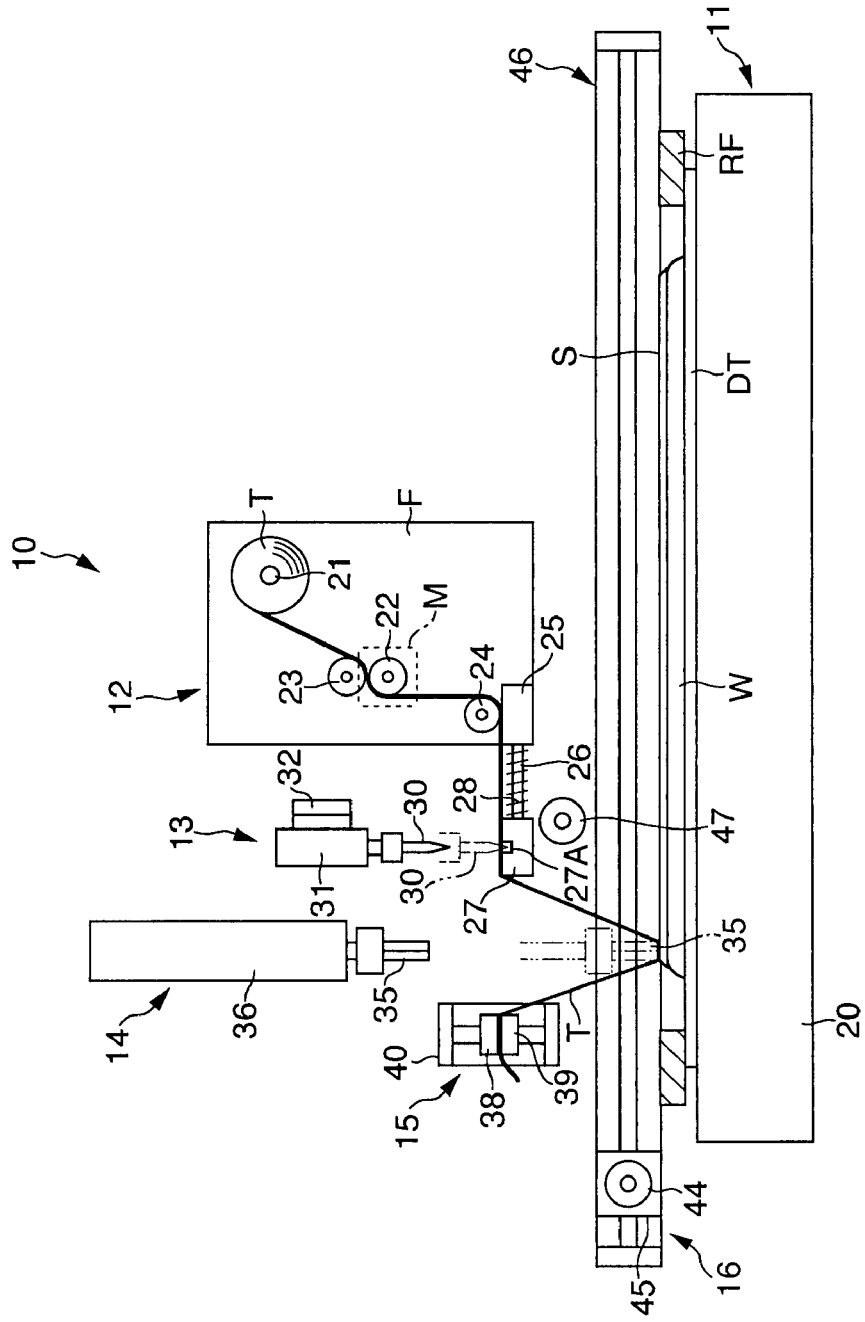
FIG. 2 is a schematic front view showing a state in which a peeling tape is stuck on an adhesive sheet.

The sticking means 14, as also shown in FIG. 2, comprises a heat block 35, and a cylinder 36 for moving ahead and back the heat block 35 in a vertical direction therein, wherein the peeling tape T is welded to an outer peripheral portion of the adhesive sheet S by a tip, i.e. a lower end of the heat block 35.

The holding means 15 comprises an upper chuck 38 and a lower chuck 39, and a chuck cylinder 40 as a displacement mechanism for supporting the chucks 38 and 39 so that the chucks 38 and 39 can move closer to/away from each other. The holding means 15 is provided movably in a left and right direction in FIG. 1 through a moving means (not shown).

The peeling means 16 comprises: a peeling roller 44 designed to be longer than the diameter of the wafer W; a uniaxial robot 46 including a slider 45 for supporting the peeling roller 44 movably in a left and right direction in FIG. 1; and a nip roller 47 disposed close to a lower portion of the tape guide plate 27.

Next, a sheet peeling method using the sheet peeling apparatus 10 in the embodiment will be described further with reference to FIGS. 3 and 4.

In an initial setting, as shown in FIG. 1, the lead end of a peeling tape T is set to be located within the recessed portion of the tape guide plate 27.

When a wafer W stuck with an adhesive sheet S is transferred to the table 20 through a transfer device (not shown), the chuck cylinder 40 moves rightward in FIG. 1, and moves back the tape guide plate 27 rightward to position the lead end side of the peeling tape T between the upper chuck 38 and the lower chuck 39. In such a state, the upper and lower chucks 38 and 39 move toward each other to sandwich the lead end side of the peeling tape T, and the holding means 15 returns to an initial position shown in FIG. 1, so that the peeling tape T is pulled out.

Then, as shown in dashed-two dotted lines in FIG. 2, the heat block 35 of the sticking means 14 moves ahead downward, and further pulls out the peeling tape T. A tip thereof presses the peeling tape T on the outer peripheral portion of the adhesive sheet S, thereby welding the peeling tape T to the adhesive sheet S. Concurrently, the cutter blade 30 of the cutting means 13 is lowered and moves in a direction perpendicular to the paper surface in FIG. 1, so that the peeling tape T is cut.

Figure 3:
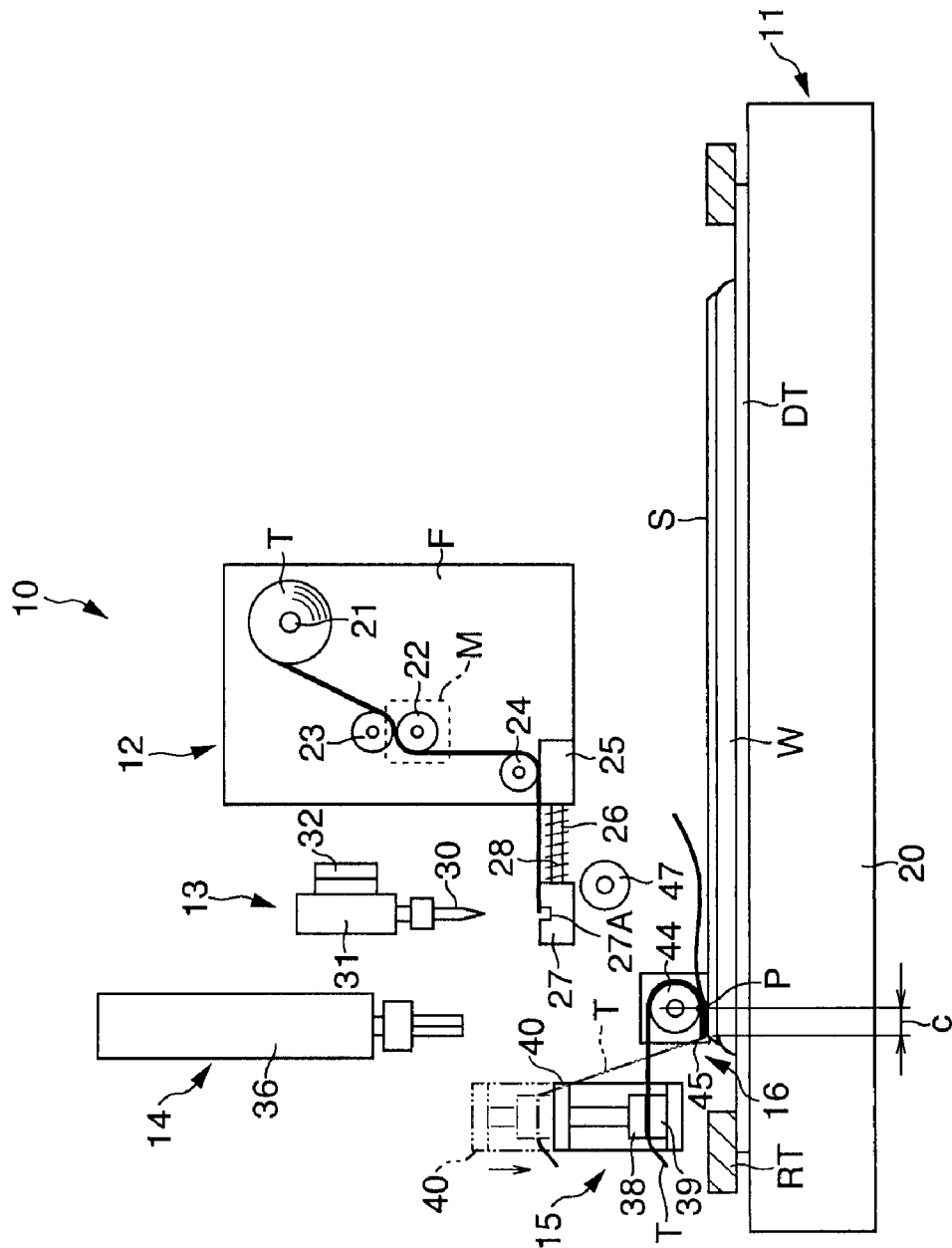
FIG. 3 is a schematic front view of showing a state in which a turned-back portion is formed.
Figure 4A:
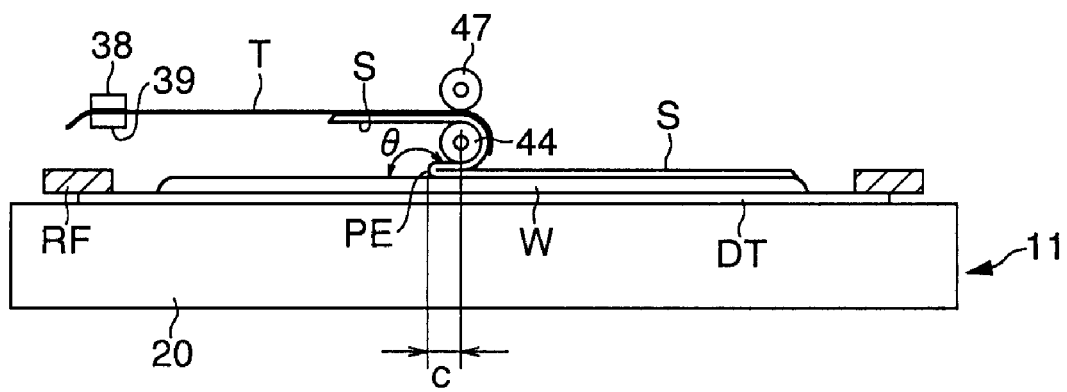
FIGS. 4(A) and 4(B) are explanatory views for an operation showing an operation in which the peeling sheet is peeled off.
Figure 4B:
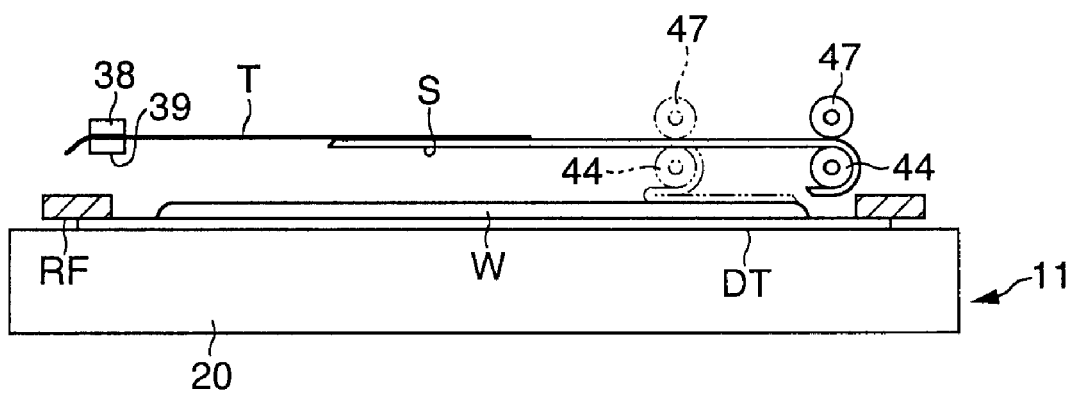
Figure 5:
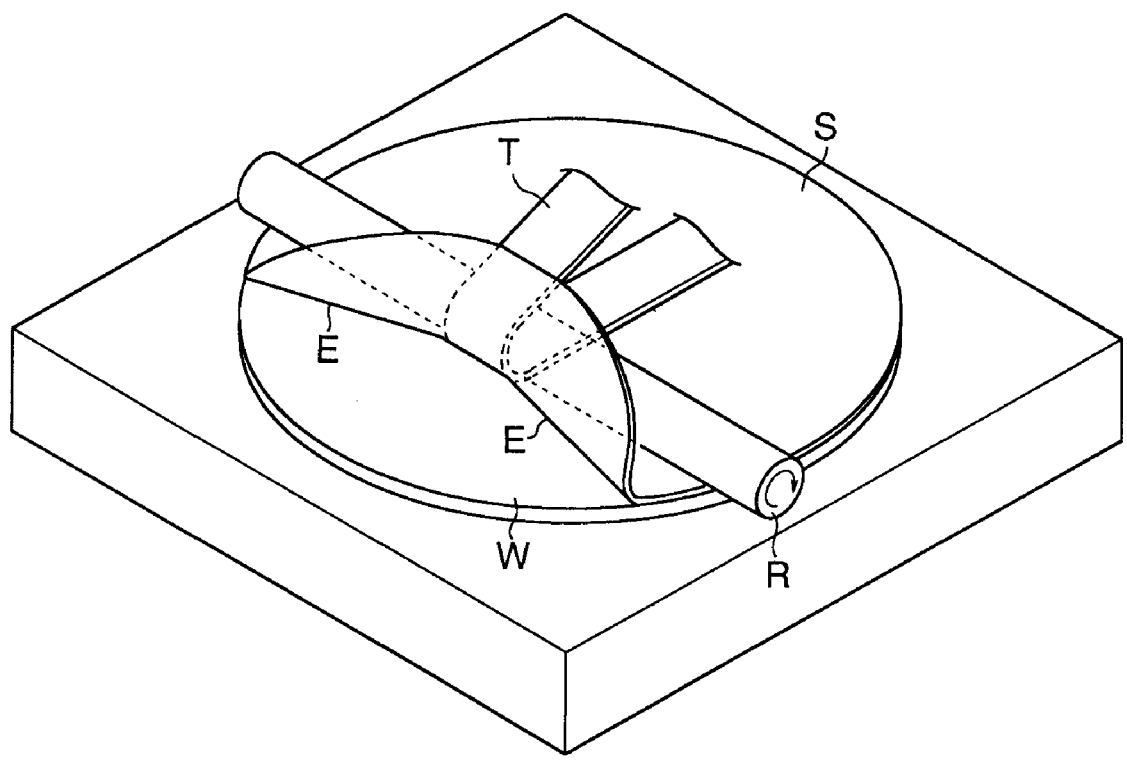
FIG. 5 is a schematic perspective view for describing a disadvantage in a conventional peeling apparatus.

When the cutting of the peeling tape T is completed, the peeling roller 44 moves to right, and the chuck cylinder 40 is lowered to form a turned-back portion c, as shown in FIG. 3, at a stage before the peeling roller 44 abuts with the peeling tape T. The turned-back portion c is formed so that it extends from the lowest point P of the peeling roller 44 to the left side in FIG. 3 i.e. a portion in which the peeling tape T is welded. By forming the turned-back portion c in this way, peeling at an obtuse angle of the adhesive sheet S can be realized. Note that, in the embodiment, a peeling angle θ is about 180 degrees, as shown in FIG. 4(A). Further, the chuck cylinder 40 is lowered to a position where a surface of the peeling tape T extending between the peeling roller 44 and the upper and lower chucks 38 and 39 is parallel to an upper surface of the adhesive sheet S. This ensures that the turned-back portion c is maintained until peeling of the adhesive sheet S is completed. In other words, the length of the turned-back portion c is kept constant.

In such a state, the nip roller 47 is moved, so that the peeling roller 44 and the nip roller 47 sandwich the peeling tape T. The peeling roller 44 and the nip roller 47 move further rightward, thereby being capable of performing full peeling while maintaining a peeled edge PE in a state that a peeled end side of the adhesive sheet S is folded under the peeling roller 44 (see FIG. 4(B)).

Therefore, according to this embodiment, the peeled edge PE can be maintained in a linear arrangement along an axis of the peeling roller 44, so that peeling delay can be avoided which occurs when the adhesive sheet S is peeled off using the strip-shaped peeling tape T.

The best arrangement, method and the like for carrying out the present invention have been disclosed so far. However, the present invention is not limited to the above.

That is, the present invention has been illustrated and described mainly about a specific embodiment. However, it is possible for those skilled in the art to add various modifications, if necessary, to the above-described embodiment with respect to shape, location, layout and the like without departing from the technical spirit and the range of the object of the present invention.

For example, the peeling tape T that adopts a continuous tape has been illustrated and described, but a peeling tape of sheet-fed type may be fed to be welded to the adhesive sheet S. Moreover, a heat-sensitive adhesive tape or a pressure-sensitive adhesive tape may be used as the peeling tape T.

Moreover, it is possible to control such that the table 20 constituting the supporting means 11 and the holding means 15 are configured to be capable of moving along an extension direction of the uniaxial robot 46, and the supporting means 11 and the holding means 15 move in a direction of peeling off the adhesive sheet S in synchronization with the peeling means 16. Also, it is possible to control such that the peeling means 16 is set to be in a stopped state and the supporting means 11 and the holding means 15 move in a direction of peeling off the adhesive sheet S.

Further, adherends are not limited to semiconductor wafers W, but may also include glass plates, steel plates, ceramics, wooden boards, resin plates, or the like, and other adherends; and the semiconductor wafers may be silicon wafers or compound wafers.

What is claimed is:

1. A sheet peeling apparatus comprising:
   a supporting means for supporting an adherend stuck with an adhesive sheet;
   a feeding means for feeding out a peeling tape for peeling off the adhesive sheet;
   a sticking means for sticking the peeling tape to the adhesive sheet in a state in which a lead end side of the peeling tape is positioned outside the outer circumference of the adhesive sheet;
   a holding means for holding the lead end side of the peeling tape; and
   a peeling means for imparting a peeling force to the adhesive sheet by movement relative to the supporting means, wherein
   the peeling means includes a peeling roller positioned to abut an adhesive agent layer side of the peeling tape stuck on the adhesive sheet, and the adhesive sheet is peeled off by movement of the peeling roller relative to the supporting means in a state in which a turned-back portion is formed by turning back a peeled end side of the adhesive sheet, and then the peeling tape is wound around the outer circumference of the peeling roller,
   the holding means includes a displacement mechanism, and enables the turned-back portion to be formed by slackening the peeling tape, and
   when the peeling off is made, the displacement mechanism is lowered to a position where a surface of the peeling tape extending between the peeling roller and the holding means is parallel to an upper surface of the adhesive sheet.

2. A sheet peeling apparatus comprising:
   a supporting means for supporting an adherend stuck with an adhesive sheet;
   a feeding means for feeding out a peeling tape for peeling off the adhesive sheet;
   a sticking means for sticking the peeling tape to the adhesive sheet in a state in which a lead end side of the peeling tape is positioned outside the outer circumference of the adhesive sheet;
   a holding means for holding the lead end side of the peeling tape; and
   a peeling means for imparting a peeling force to the adhesive sheet by movement relative to the supporting means, wherein
   the peeling means includes a peeling roller positioned to abut an adhesive agent layer side of the peeling tape stuck on the adhesive sheet, and the adhesive sheet is peeled off by movement of the peeling roller relative to the supporting means in a state in which a turned-back portion is formed by turning back a peeled end side of the adhesive sheet, and then the peeling tape is wound around the outer circumference of the peeling roller, and
   the peeling means further includes a nip roller, and the peeling roller and the nip roller sandwich the peeling tape and move to the peeling direction, thereby being capable of performing full peeling while maintaining a peeled edge in a state that the peeled end side of the adhesive sheet is folded under the peeling roller.

\* \* \* \* \*